(12) United States Patent
Zhou

(10) Patent No.: US 10,297,595 B2
(45) Date of Patent: May 21, 2019

(54) FIN-FET DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/473,726

(22) Filed: Mar. 30, 2017

(65) Prior Publication Data
US 2017/0330879 A1    Nov. 16, 2017

(30) Foreign Application Priority Data
May 13, 2016   (CN) .......................... 2016 1 0318186

(51) Int. Cl.
*H01L 21/768*  (2006.01)
*H01L 27/088*  (2006.01)
(Continued)

(52) U.S. Cl.
CPC ...... *H01L 27/0886* (2013.01); *H01L 21/0273* (2013.01); *H01L 21/0332* (2013.01);
(Continued)

(58) Field of Classification Search
CPC ............ H01L 21/0273; H01L 21/0332; H01L 21/32139; H01L 21/76897;
(Continued)

(56) References Cited

U.S. PATENT DOCUMENTS

2014/0035045 A1   2/2014  Alptekin et al.
2014/0349452 A1   11/2014 Wang et al.
(Continued)

FOREIGN PATENT DOCUMENTS

JP   2008235925 A   10/2008

OTHER PUBLICATIONS

The European Patent Office (EPO) The Extended European Search Report for 17169813.7 dated Aug. 14, 2017 8 Pages.

*Primary Examiner* — Cuong Q Nguyen
(74) *Attorney, Agent, or Firm* — Anova Law Group, PLLC

(57) ABSTRACT

A method for fabricating a Fin-FET device includes forming a fin structure on a semiconductor substrate having two peripheral regions and a core region, forming a plurality of dummy gate structures across the fin structure in the core region with each including a dummy gate electrode layer on top and sidewall surfaces of the fin structure, and forming a barrier structure across the fin structure in each peripheral region. The method also includes forming a plurality of source/drain regions in the fin structure between neighboring barrier structure and dummy gate structure and also between neighboring dummy gate structures, and forming a first interlayer dielectric layer at least on the fin structure to cover sidewall surfaces of the dummy gate structures and the barrier structures. Further, the method includes removing the dummy gate electrode layers to form a plurality of openings and forming a metal gate electrode layer in each opening.

20 Claims, 5 Drawing Sheets

(51) Int. Cl.
*H01L 21/027* (2006.01)
*H01L 21/033* (2006.01)
*H01L 21/3213* (2006.01)
*H01L 21/8234* (2006.01)
*H01L 29/06* (2006.01)
*H01L 29/49* (2006.01)
*H01L 29/51* (2006.01)
*H01L 29/66* (2006.01)

(52) U.S. Cl.
CPC .. *H01L 21/32139* (2013.01); *H01L 21/76897* (2013.01); *H01L 21/823418* (2013.01); *H01L 21/823431* (2013.01); *H01L 21/823437* (2013.01); *H01L 21/823481* (2013.01); *H01L 29/0649* (2013.01); *H01L 29/4925* (2013.01); *H01L 29/513* (2013.01); *H01L 29/66545* (2013.01); *H01L 29/66636* (2013.01); *H01L 29/66795* (2013.01)

(58) Field of Classification Search
CPC ..... H01L 21/823418; H01L 21/823431; H01L 21/823437; H01L 21/823481
See application file for complete search history.

(56) References Cited

U.S. PATENT DOCUMENTS

| | | | |
|---|---|---|---|
| 2015/0243659 A1* | 8/2015 | Huang | H01L 21/823481 257/401 |
| 2015/0340466 A1 | 11/2015 | Fukuda et al. | |
| 2016/0336429 A1* | 11/2016 | Peng | H01L 29/66795 |

* cited by examiner

FIN-FET DEVICES AND FABRICATION METHODS THEREOF

CROSS-REFERENCES TO RELATED APPLICATIONS

This application claims the priority of Chinese Patent Application No. CN201610318186.4, filed on May 13, 2016, the entire content of which is incorporated herein by reference.

FIELD OF THE DISCLOSURE

The present disclosure generally relates to the field of semiconductor fabrication technology and, more particularly, relates to Fin-FET devices and fabrication methods thereof.

BACKGROUND

Metal-oxide-semiconductor (MOS) transistor is one of the most important components in modern integrated circuits (ICs). The base structure of a MOS transistor includes a semiconductor substrate, a gate structure formed on the surface of the semiconductor substrate, and a source region and a drain region formed in the semiconductor substrate on the two sides of the gate structure. In addition, the gate structure includes a gate dielectric layer formed on the surface of the semiconductor substrate and a gate electrode layer formed on the gate dielectric layer.

With the development of semiconductor technology, the feature size of semiconductor devices continuously decreases, and the controllability of traditional planar MOS transistors on channel current tends to be insufficient, causing severe leakage current. Fin field-effect-transistor (Fin-FET) is an emerging multi-gate device. Generally, a Fin-FET includes a fin structure protruding from the surface of a semiconductor substrate, a gate structure covering a portion of the top and the sidewall surfaces of the fin structure, and a source region and a drain region formed in the fin structure on the two sides of the gate structure.

However, the electrical performance of the Fin-FETs fabricated by existing methods may still need to be improved. The disclosed Fin-FET devices and the fabrication methods are directed to solve one or more problems set forth above and other problems in the art.

BRIEF SUMMARY OF THE DISCLOSURE

One aspect of the present disclosure includes a method for fabricating a Fin-FET device. The method includes forming a fin structure on a semiconductor substrate having two peripheral regions and a core region between the two peripheral regions, forming a plurality of dummy gate structures across the fin structure in the core region with each dummy gate structure including a dummy gate electrode layer formed on top and sidewall surfaces of the fin structure, and forming a barrier structure across the fin structure in each peripheral region. The method also includes forming a plurality of source/drain regions in the fin structure between each barrier structure and the neighboring dummy gate structure and also between neighboring dummy gate structures, and forming a first interlayer dielectric layer at least on the fin structure. The first interlayer dielectric layer covers sidewall surfaces of the dummy gate structures and sidewall surfaces of the barrier structures. Further, the method includes removing the dummy gate electrode layers to form a plurality of openings and forming a metal gate electrode layer in each opening.

Another aspect of the present disclosure provides a Fin-FET device. The Fin-FET device includes a semiconductor substrate, a fin structure formed on the semiconductor substrate having a core region and two peripheral regions separated by the core region, a plurality of metal gate structures formed across the fin structure in the core region and covering top and sidewall surfaces of the fin structure, a barrier structure formed in each peripheral region across the fin structure and covering top and sidewall surfaces of the fin structure, a plurality of source/drain regions formed in the fin structure between each barrier structure and a neighboring metal gate structure and between neighboring metal gate structures, and a first interlayer dielectric layer formed at least on the fin structure and covering sidewall surfaces of the metal gate structures and the barrier structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

For Fin-FETs fabricated by existing methods, the electric performance still needs to be improved. In the following, an example will be provided to illustrate the problems in existing Fin-FET devices. FIGS. 1-4 show schematic cross-section views of semiconductor structures corresponding to certain stages of an existing fabrication process for a Fin-FET device.

Figure 1:
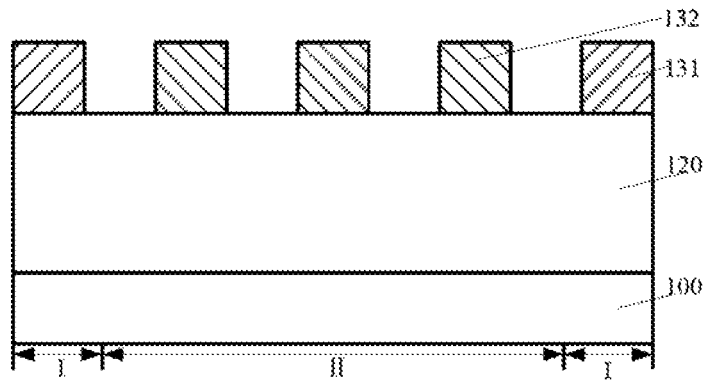
FIGS. 1-4 illustrate schematic cross-section views of semiconductor structures corresponding to certain stages of an existing fabrication process for Fin-FETs.

Referring to FIG. 1, a semiconductor substrate 100 is provided. A fin structure 120 is formed on the surface of the semiconductor substrate 100. The fin structure 120 includes two peripheral regions I and a core region II separating the two peripheral regions I from each other. A plurality of dummy gate structures 132 are formed across the portion of the fin structure 120 in the core region II, while an additional gate structure 131 is formed across the portion of the fin structure 120 in each peripheral region I. For illustration purposes, the semiconductor device shown in FIG. 1 is described to have three dummy gate structures formed in the core region II, although the actual number of the dummy gate structures may be more than or less than three.

Figure 2:
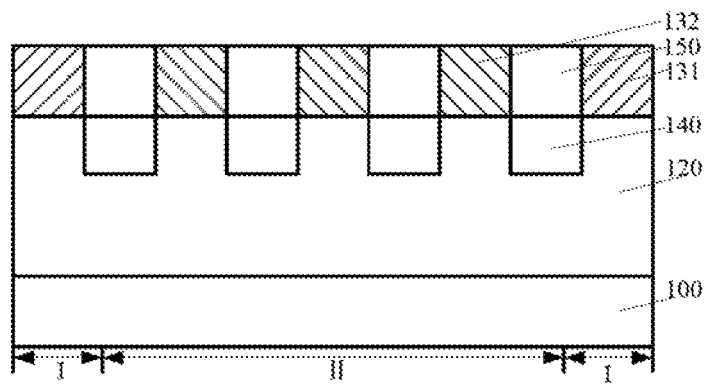

Referring to FIG. 2, a plurality of source/drain regions 140 are formed in fin structures between neighboring dummy gate structures 132 and also between each additional gate structure 131 and a neighboring dummy gate structure 132. After forming the plurality of source/drain regions 140, a first interlayer dielectric layer 150 is formed on the semiconductor substrate 100 and the fin structure 130 to cover the sidewall surfaces of the dummy gate structures 132 as well as the sidewall surfaces of the additional gate structures 131.

The additional gate structure 131 in each peripheral region I is formed to ensure a uniform growth rate of a source/drain-region material layer subsequently formed at the boundary between the core region II and the peripheral region I. Specifically, the presence of the additional gate structure 131 may prevent the growth rate of the source/drain-region material layer from decreasing in the area from the near side of the dummy gate structure 132 to the far side of the dummy gate structure 132. Therefore, the additional gate structure 131 may prevent the source/drain region 140 formed between the additional gate structure 131 and the neighboring dummy gate structure 132 from subsiding. Therefore, the stress in the corresponding channel region may not be reduced.

Figure 3:
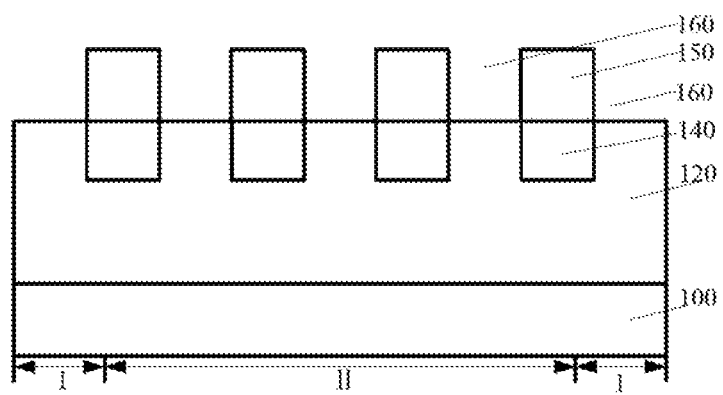

Referring to FIG. 3, after forming the first interlayer dielectric layer 150, the plurality of dummy gate structures 132 and the additional gate structure 131 in each peripheral region I are removed to form a plurality of openings 160.

Figure 4:
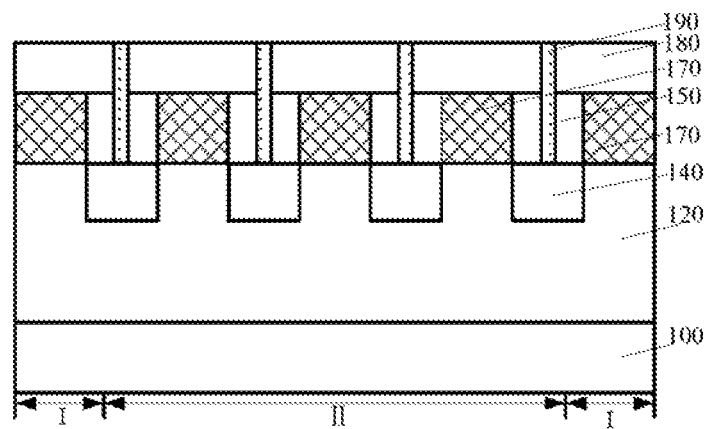

Referring to FIG. 4, further, a plurality of metal gate structures 170 are formed in the plurality of openings 160 (referring to FIG. 3). A second interlayer dielectric layer 180 is then formed on the plurality of metal gate structures 170 and also on the first interlayer dielectric layer 150. Further, a conductive plug 190 is formed on each source/drain region 140 through the first interlayer dielectric layer 150 and the second interlayer dielectric layer 180.

However, the electrical performance of the Fin-FET device formed by the method described above may need to be improved. Specifically, according to the fabrication method, the additional gate structures 131 formed in the peripheral regions I are simultaneously removed when the plurality of dummy gate structures 132 formed in the core region II are removed. For illustration purpose, the openings 160 formed by removing the additional gate structures 131 are designated as first openings, while the openings 160 formed by removing the dummy gate structures 132 are designated as second openings. As a consequence, during the subsequent process for forming the metal gate structures 170, the metal gate structures 170 are simultaneously formed in both the first openings and the second openings. That is, the metal gate structures 170 are formed in the peripheral regions I to occupy the first openings.

Further, the metal gate electrode layer in the metal gate structures 170 is made of a metal, which has relatively large electrical conductivity. Therefore, the parasitic capacitance between the metal gate electrode layer formed in the first opening and the corresponding conductive plug 190 may be large, and thus the parasitic capacitance of the Fin-FET may be significantly increased.

As described above, the existing fabrication methods for Fin-FET devices may prevent reduction of the induced stress in the corresponding channel by the source/drain region 140 formed between each additional gate structure 131 and the neighboring metal gate structure 170. However, in the meantime, the existing fabrication methods may also lead to an increased parasitic capacitance in the formed Fin-FET devices.

Figure 11:
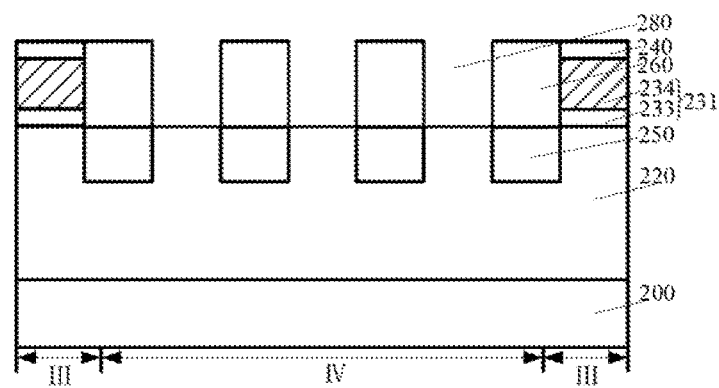
Figure 12:
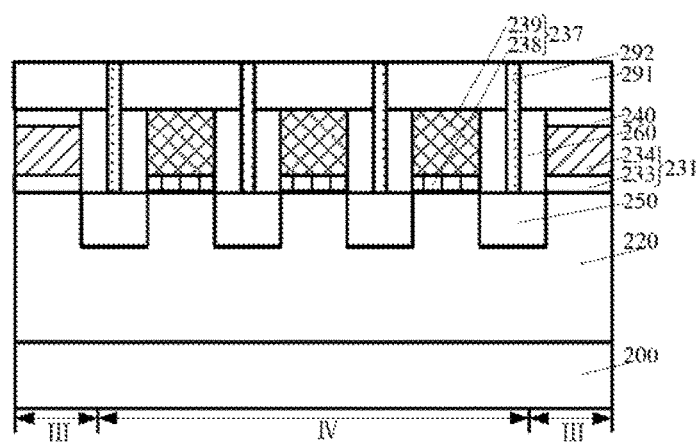
Figure 13:
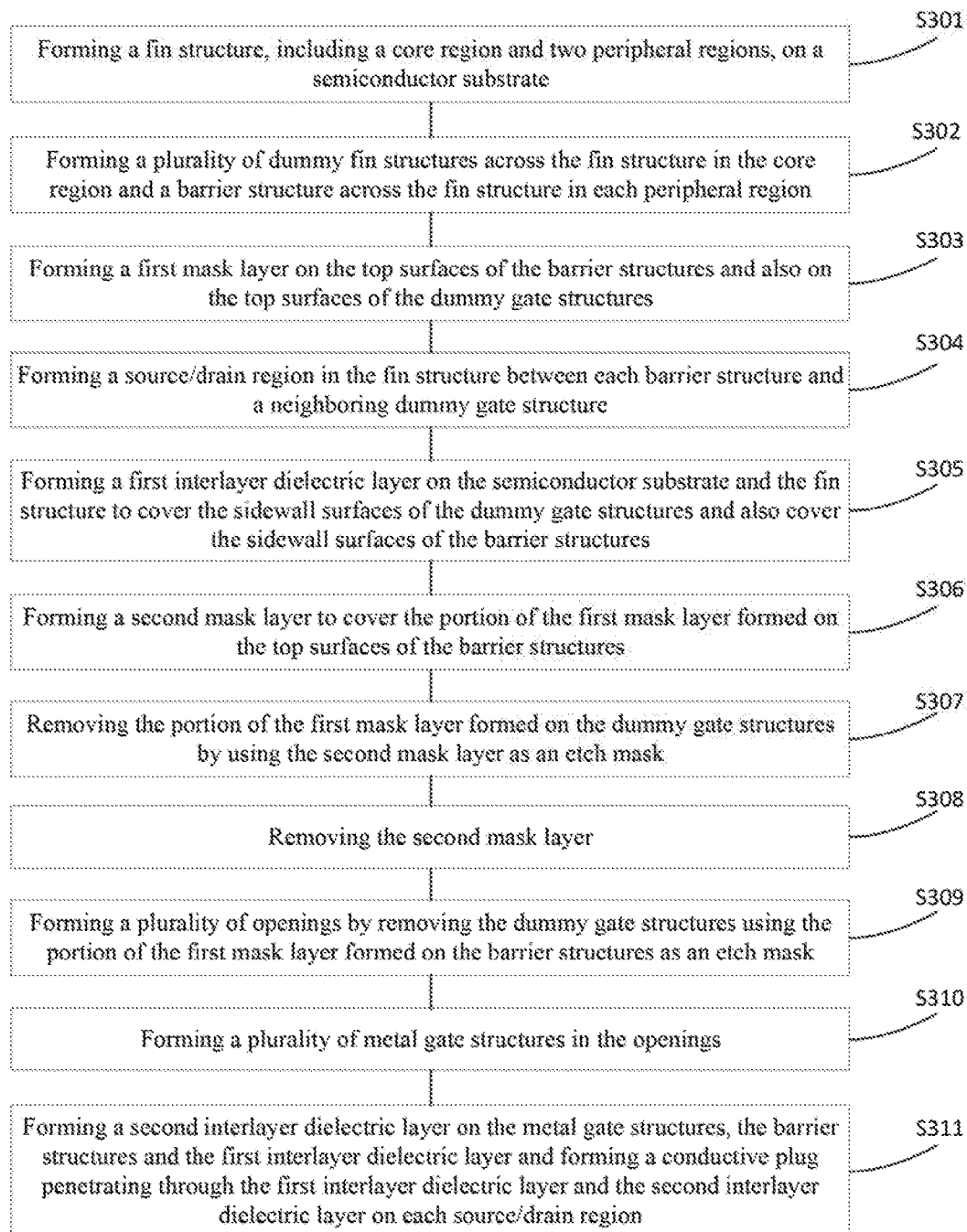
FIG. 13 illustrate a flowchart of an exemplary fabrication process consistent with disclosed embodiments.

The present disclosure provides a method for fabricating a Fin-FET device. FIG. 13 shows a flowchart of an exemplary fabrication process consistent with disclosed embodiments. FIGS. 5-12 show schematic cross-section views of semiconductor structures corresponding to certain stages of the exemplary fabrication process.

Figure 5:
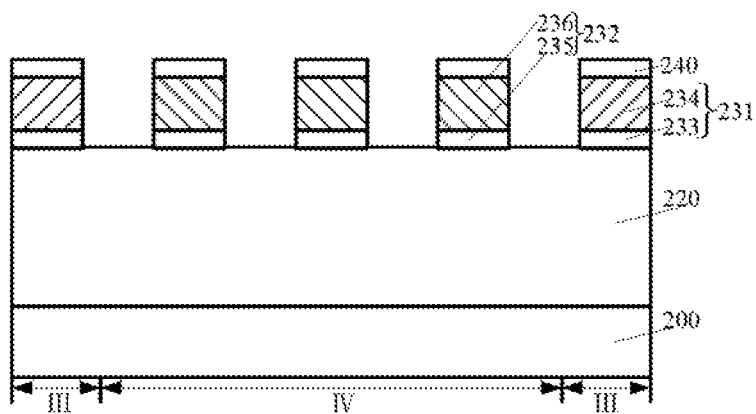
FIGS. 5-12 illustrate schematic cross-section views of semiconductor structures corresponding to certain stages of an exemplary fabrication process for Fin-FETs consistent with disclosed embodiments.

Referring to FIG. 13, at the beginning of the fabrication process, a fin structure, including a core region and two peripheral regions, may be formed on a semiconductor substrate (S301). FIG. 5 shows a schematic cross-section view of a corresponding semiconductor structure along the extending direction of the fin structure.

Referring to FIG. 5, a semiconductor substrate 200 is provided. Further, a fin structure 220 may be formed on the semiconductor substrate 200. The fin structure 220 may include two peripheral regions III and a core region IV separating the two peripheral regions III.

The semiconductor substrate 200 may provide an operation platform for the subsequent fabrication process for forming the Fin-FET device. The semiconductor substrate 200 may be made of single-crystalline silicon, polycrystalline silicon, or amorphous silicon. The semiconductor substrate 200 may also be made of germanium, SiGe, AsGa, or any other appropriate semiconductor material. In one embodiment, the semiconductor substrate 200 is made of silicon.

The fin structure 220 may be formed on the surface of the semiconductor substrate 200 by removing a portion of the semiconductor substrate 200 through etching. Alternatively, the fin structure 220 may also be formed by a process including forming a fin-structure material layer on the semiconductor substrate 200, and then patterning the fin-structure material layer to further form the fin structure 220.

The fin structure 220 may include two peripheral regions III and a core region IV. Specifically, the two peripheral regions III may be situated on each side of the core region IV. That is, the core region IV may separate the two peripheral regions III.

An isolation structure may also be formed on the surface of the semiconductor substrate 200. The top surface of the isolation structure may be lower than the top surface of the fin structure 220. The isolation structure may be used to electrically isolate the fin structure 220 from neighboring fin structures 220 when multiple fin structures are simultaneously formed. The isolation structure may be formed by a material such as $SiO_x$, SiON, etc.

Returning to FIG. 13, further, a plurality of dummy fin structures may be formed across the fin structure in the core region and a barrier structure may be formed across the fin structure in each peripheral region (S302). FIG. 5 shows a schematic cross-section view of a corresponding semiconductor structure with the plurality of dummy gate structures formed in the core region and the barrier structures formed in the peripheral regions.

Referring to FIG. 5, a plurality of dummy gate structures 232 may be formed across the fin structure 220 in the core region IV and a barrier structure 231 may be formed across the fin structure 220 in each of the two peripheral regions III. Each dummy gate structure 232 may include a dummy gate electrode layer 236 formed over a portion of the top and the sidewall surfaces of the fin structure 220.

Each dummy gate structure 232 may be formed across the fin structure 220 in the core region IV. The dummy gate structure 232 may cover a portion of the top and the sidewall surfaces of the fin structure 220 in the core region IV. The dummy gate structure 232 may include a dummy gate electrode layer 235 formed across the fin structure 220 in the core region IV and the dummy gate electrode layer 236 formed on the surface of the dummy gate dielectric layer 235. Specifically, the dummy gate dielectric layer 235 may be situated on the surface of the isolation structure and also cover a portion of the top and sidewall surfaces of the fin structure 220.

At least one dummy gate structure 232 may be formed across the fin structure 220 in the core region IV. However, for illustration purpose, the semiconductor structures shown in FIGS. 5-12 are described to have three dummy gate structures 232 formed in the core region IV.

The dummy gate electrode layer 236 may be made of polycrystalline silicon. Further, when only the dummy gate electrode layer 236 needs to be removed in a subsequent process to form an opening for further fabrication of a gate structure, the dummy gate dielectric layer 235 may be used as the gate dielectric layer of the gate structure. Therefore, the dummy gate dielectric layer 235 may be formed by a high-k dielectric material (i.e. a material with a relative dielectric constant k larger than 3.9). When both the dummy gate electrode layer 236 and the dummy dielectric layer 235 need to be removed in a subsequent process to form an opening for further fabrication of a gate structure, a new dielectric layer may then be formed on the bottom and the sidewall surfaces of the opening to serve as the gate dielectric layer of the gate structure. In such a case, the dummy gate dielectric layer 235 may be made of $SiO_x$.

In one embodiment, both the dummy gate electrode layer 236 and the dummy gate dielectric layer 235 may be removed to form an opening for further fabrication of a gate structure. In other embodiments, an opening may be formed by only remove the dummy gate electrode layer 236. That is, in such a case, the dummy gate dielectric layer 235 may be directly used as the gate dielectric layer of the subsequently-formed gate structure.

The barrier structure 231 may have two major functions. First, during the fabrication process to form a source/drain region between the barrier structure 231 and the neighboring dummy gate structure, the barrier structure 231 may prevent the growth rate of the source/drain-region material layer from decreasing along a direction from the dummy gate structure 232 to the barrier structure 231, and thus the presence of the barrier structure may prevent the source/drain region formed between the barrier structure 231 and the dummy gate structure 232 from subsiding. Second, the barrier structure 231 may be made of a material with desired insulating properties. As such, after further forming a metal gate electrode layer to replace the dummy gate electrode layer 236 and further forming a conductive plug on the source/drain region between the barrier structure 231 and the metal gate electrode layer, the parasitic capacitance between the barrier structure 231 and the conductive plug may be small.

The electrical conductivity of the barrier structure 231 may be smaller than 3.0E-4 S/m. Having the electrical conductivity of the barrier structure 231 below 3.0E-4 S/m is due to the following consideration: when the conductivity of the barrier structure 231 is too large, the insulating properties of the barrier structure 231 may not be desired, and the large electrical conductivity of the barrier structure 231 may further lead to a relatively large parasitic capacitance between the barrier structure 231 and the conductive plug subsequently-formed on one side of the barrier structure 231. In one embodiment, forming the barrier structure with electrical conductivity below 3.0E-4 S/m may ensure that the formed barrier structure 231 is insulating or has weak electrical conduction, and thus the parasitic capacitance between the barrier structure 231 and the conductive plug subsequently-formed on one side of the barrier structure 231 may be zero or very small.

In one embodiment, the barrier structure 231 may be formed simultaneously with the formation of the dummy gate structures 232 so that the barrier structure 231 may include a barrier gate dielectric layer 233 formed across the fin structure 220 in the peripheral region III and a barrier gate electrode layer 234 formed on the barrier gate dielectric layer 233. In other embodiments, the barrier structures in the peripheral regions 111 and the dummy gate structures in the core region may be formed separately by different fabrication processes.

The barrier gate dielectric layer may be made of $SiO_x$ or a high-k dielectric material. The barrier gate electrode layer 234 may be made of polycrystalline silicon.

Specifically, the plurality of dummy gate structures 232 and the barrier structures 231 may be formed by a method including the following steps. First, a dummy gate dielectric material layer (not shown) may be formed on the semiconductor substrate 200 to cover the fin structure 220 in both the peripheral region III and the core region IV. Then, a dummy gate electrode material layer (not shown) may be formed on the surface of the dummy gate dielectric material layer. Further, the dummy gate electrode material layer and the dummy gate dielectric material layer may be patterned to form the plurality of dummy gate structures 232 in the core region IV and also form a barrier structure 231 in each peripheral region III.

Specifically, after patterning the dummy gate electrode material layer and the dummy gate dielectric material layer, the barrier gate dielectric layer 233 may correspond to the portion of the dummy gate dielectric material layer formed in the peripheral region III and the barrier gate electrode layer 234 may correspond to the portion of the dummy gate electrode material layer formed in the peripheral region III; the dummy gate dielectric layer 235 may correspond to the portion of the dummy gate dielectric material layer formed in the core region IV and the dummy gate electrode layer 236 may correspond to the portion of the dummy gate electrode material layer formed in the core region IV.

In one embodiment, because the plurality of dummy gate structures 232 and the barrier structures 231 are simultaneously formed, the fabrication process may be simplified.

In other embodiments, the barrier structure may also be formed by a single-layer material. Specifically, the barrier structure may be made of polycrystalline silicon or single-crystalline silicon. Moreover, the electrical conductivity of the single-layer barrier structure may be smaller than 3.0E-4 S/m.

Further, returning to FIG. 13, a first mask layer may be formed on the top surfaces of the barrier structures and the dummy gate structures (S303).

Referring to FIG. 5, a mask layer 240 may be formed on the top surfaces of the barrier structures 231 and the dummy gate structures 232. The first mask layer 240 may have the following functions. First, during the process to pattern the dummy gate electrode material layer and the dummy gate dielectric layer, the first mask layer 240 may be used as a hard mask layer. Second, during a subsequent process to form source/drain regions, the presence of the first mask layer may prevent the formation of the source/drain-region material layer on the top surfaces of the barrier structures 231 or on the top surfaces of the dummy gate structures 232. Third, the portion of the first mask layer 240 formed on the top surfaces of the barrier structures 231 may then be used as an etch mask to remove the plurality of dummy gate structures 232.

The first mask layer 240 may be made of SiNx, SiON, or SiCON. In one embodiment, the first mask layer 240 may be simultaneously formed with the barrier gate dielectric layer 233 and the dummy gate structures 232.

Specifically, after forming the dummy gate electrode material layer, a first mask material layer may be formed on the surface of the dummy gate electrode material layer. Further, during the process to pattern the first dummy gate electrode material layer and the dummy gate dielectric material layer, the first mask material layer may be simultaneously patterned. As such, the plurality of dummy gate structures 232, the barrier structures 231, and the first mask layer 240 may be simultaneously formed. Specifically, the first mask layer 240 may be formed on the top surfaces of the barrier structures 231 and the dummy gate structures 232. After the patterning process, the first mask layer 240 may correspond to the remaining portion of the first mask material layer.

Figure 6:
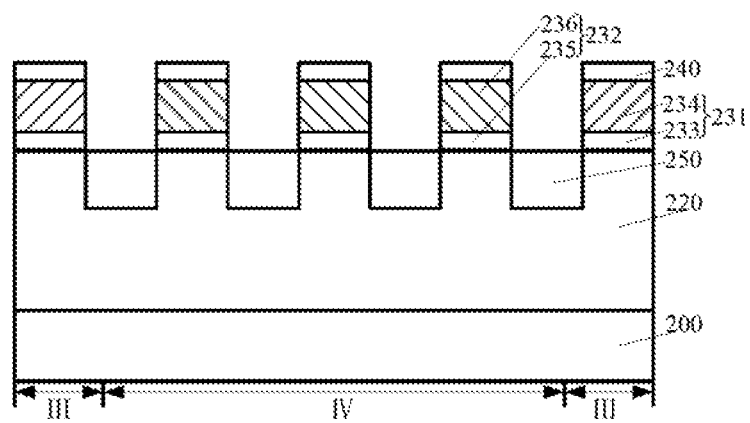

Further, returning to FIG. 13, a source/drain region may be formed in the fin structure between each barrier structure and a neighboring dummy gate structure (S304). FIG. 6 shows a schematic cross-section view of a corresponding semiconductor structure.

Referring to FIG. 6, a source/drain region 250 may be formed in the fin structure 220 between each barrier structure 231 and the neighboring dummy gate structure 232.

In one embodiment, a plurality of the dummy gate structures 232 may be formed across the fin structure in the core region IV. Accordingly, a source/drain region may also be formed in the fin structure 220 between two neighboring dummy gate structures 232.

In one embodiment, the fabrication process for the source/drain regions 250 may include the following steps. First, a portion of the fin structure 220 between two neighboring dummy gate structures 232 and also between a barrier structure 231 and the neighboring dummy gate structure 232 may be removed to form a plurality of trenches (not shown). Then, a source/drain-region material layer may be formed in the trenches, and thus the plurality of source/drain regions 250 may be formed.

In other embodiments, when only one dummy gate structure 232 is formed in the core region IV, only the portion of the fin structure 220 situated between each barrier structure 231 and the dummy gate structure 232 may need to be removed to form the trenches.

Specifically, the source/drain-region material layer may be formed by a two-step process: first, an initial source/drain-region material layer may be formed by an epitaxial growth method; then, an ion implantation process may be performed to implant doping ions into the initial source/drain-region material layer to form the source/drain-region material layer. The source/drain-region material layer may also be formed by an in-situ ion implantation method during epitaxial growth of the initial source/drain-region material layer.

In one embodiment, because of the barrier structure 231, the trench formed between the barrier structure 231 and the neighboring dummy gate structure 232 may have a trench sidewall on both sides of the trench. The trench sidewall on each side of the trench may expose the fin structure 220. The portion of the fin structure 220 exposed by the trench sidewall may serve as a seed during the formation process for the source/drain-region material layer. Therefore, because the trench sidewall exposing the fin structure 220 is formed on both sides of the trench, the growth rate of the source/drain-region material layer near the barrier structure 231 may be the same as the growth rate of the source/drain-region material layer near the dummy gate structure 232, which may prevent the formed source/drain region 250 from being caved in from the side close to the dummy gate structure 232 to the other side close to the barrier structure 231.

In one embodiment, a plurality of sidewall spacers (not shown) may be formed on both sides of each dummy gate structure 232. The sidewall spacers may also be formed on the side of each barrier structure 231 close to the core region IV. Further, the source/drain regions 250 may then be formed in the exposed portion of the fin structure 220 between neighboring sidewall spacers.

The plurality of sidewall spacers may have several functions during the subsequent fabrication process. First, the sidewall spacer formed on a sidewall surface of each dummy gate structure 232 may define the distance between the dummy gate structure 232 and the corresponding source/drain region 250. Second, during the formation process for the source/drain regions 250, the sidewall spacers may provide protection for the sidewall surfaces of the barrier structures 231 and the dummy gate structures 232, and thus prevent the formation of the source/drain-region material layer on the sidewall surfaces of the barrier structure 231 or on the sidewall surfaces of the dummy gate structures 232.

In another embodiment, prior to forming the source/drain regions, a plurality of sidewall spacers may be formed on the two sides of each dummy gate structure. That is, no sidewall spacer may be formed on the side surface of the barrier structure. Further, the source/drain regions may then be formed in the exposed portion of the fin structure next to the sidewall spacers on both sides of each dummy gate structure.

Figure 7:
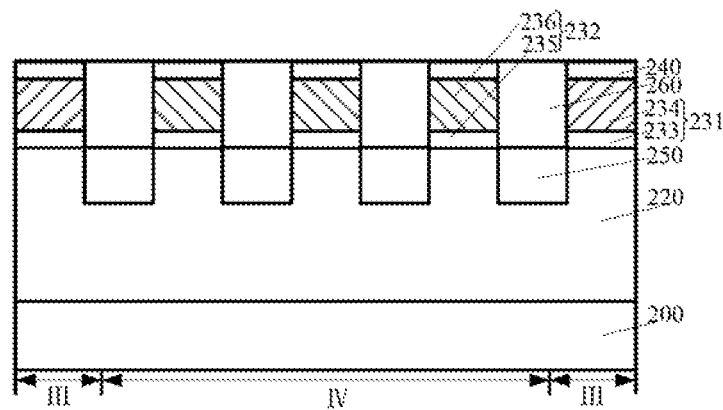

Further, returning to FIG. 13, a first interlayer dielectric layer may be formed on the semiconductor substrate and the fin structure to cover the sidewall surfaces of dummy gate structures and the sidewall surfaces of the barrier structures (S305). FIG. 7 shows a schematic cross-section view of a corresponding semiconductor structure.

Referring to FIG. 7, after forming the source/drain regions 250, a first interlayer dielectric layer 260 may be formed on the semiconductor substrate 200 that is uncovered by the fin structure and also on the fin structure 220. The first interlayer dielectric layer 260 may cover the sidewall surfaces of the plurality of dummy gate structures 232 as well as the sidewall surfaces of the barrier structures 231.

In one embodiment, because the first mask layer 240 is formed, the first interlayer dielectric layer 260 may cover the sidewall surfaces of the dummy gate structures 232, the sidewall surfaces of the barrier structures 231, and the sidewall surfaces of the first mask layer 240.

The first interlayer dielectric layer 260 may be formed by a method including the following steps. First, a first interlayer dielectric material layer may be formed to cover the dummy gate structures 232, the barrier structures 231, the first mask layer 240, the fin structure 220, and the semiconductor substrate 200. The entire top surface of the formed first interlayer dielectric material layer may be higher than the top surface of the first mask layer 240. Then, a planarization process may be performed on the first interlayer dielectric material layer until the top surface of the first mask layer 240 is exposed. After the planarization process, the first interlayer dielectric layer 260 may be formed.

In one embodiment, after forming the first interlayer dielectric material layer, the first interlayer dielectric material layer may also cover the sidewalls formed on the side surfaces of the dummy gate structures 232 and the barrier structures 231. Accordingly, after performing the planarization process, the subsequently-formed first interlayer dielectric layer 260 may still cover the side surfaces of the sidewalls.

In another embodiment, the first mask layer may not be formed, and the entire top surface of the first interlayer dielectric material layer may be formed higher than the top surfaces of the dummy gate structures and the barrier structures. The first interlayer dielectric layer may then be formed through a planarization process performed on the first interlayer dielectric material layer until the top surfaces of the dummy gate structures are exposed.

In one embodiment, the first interlayer dielectric material layer 260 may be made of a material including $SiO_x$, SiON, SiCO, etc.

Figure 8:
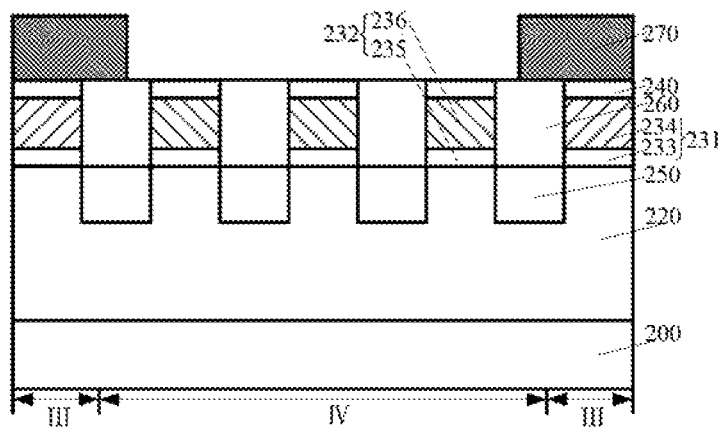

Referring to FIG. 13, further, a second mask layer may be formed to cover the portion of the first mask layer formed on the top of the barrier structures (S306). FIG. 8 shows a schematic cross-section view of a corresponding semiconductor structure.

Referring to FIG. 8, a second mask layer 270 may be formed. The second mask layer 270 may cover the portion of the first mask layer 240 formed on the top surfaces of the barrier structures 231. The second mask layer 270 may also cover a portion of the first interlayer dielectric layer formed on the top of the source/drain region 250 between each barrier structure 231 and the neighboring dummy gate structure 232.

In one embodiment, the second mask layer 270 may be made of a photoresist material. The second mask layer 270 may cover the portion of the first mask layer 240 formed on the barrier structure 231 and expose the portion of the first mask layer 240 formed on the plurality of dummy gate structures 232.

Figure 9:
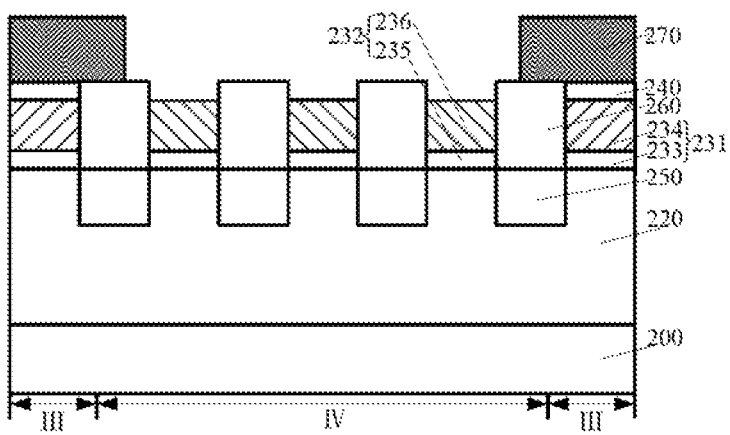

Further, returning to FIG. 13, the portion of the first mask layer formed on the dummy gate structures may be removed by using the second mask layer as an etch mask (S307). FIG. 9 shows a schematic cross-section view of a corresponding semiconductor structure.

Referring to FIG. 9, the portion of the first mask layer 240 formed on the dummy gate structures 232 may be removed by using the second mask layer 270 as an etch mask. The portion of the first mask layer 240 on the dummy gate structures 232 may be removed by a wet etching process or a dry etching process.

Figure 10:
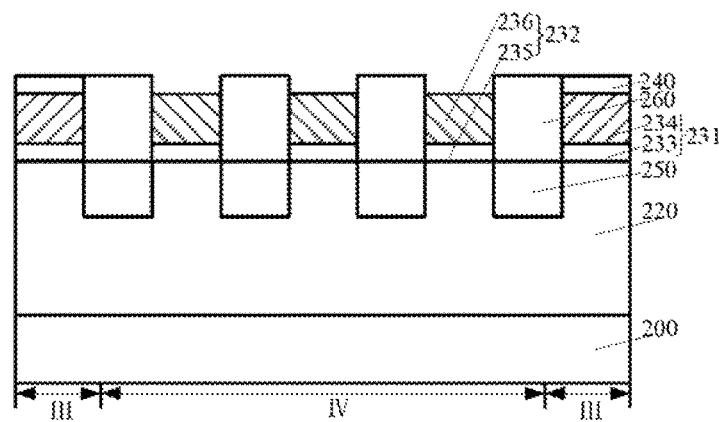

Further, returning to FIG. 13, the second mask layer may be removed (S308). FIG. 10 shows a cross-section view of a corresponding semiconductor structure.

Referring to FIG. 10, after removing the portion of the first mask layer 240 formed on the top of the dummy gate structures 232, the second mask layer (referring to FIG. 9) may then be removed.

Further, returning to FIG. 13, a plurality of openings may be formed by removing the dummy gate electrode layers as well as the dummy gate dielectric layers using the portion of the first mask layer formed on the barrier structures as an etch mask (S309). FIG. 11 shows a schematic cross-section view of a corresponding semiconductor structure.

Referring to FIG. 11, after removing the second mask layer 270 (referring to FIG. 9), the plurality of dummy gate electrode layers 236 (referring to FIG. 9) and the plurality of dummy gate dielectric layers 235 (referring to FIG. 9) may be removed by using the portion of the first mask layer 240 formed on the barrier structures 231 as an etch mask. After removing the dummy gate electrode layers 236 and the dummy gate dielectric layers 235, a plurality of openings 280 may be formed.

The dummy gate electrode layers 236 and the dummy gate dielectric layers 235 may be removed by an etching process using the portion of the first mask layer 240 formed on the barrier structures 231 as the etch mask. The etching process may use a dry etching method or a wet etching method, or a method combining both dry etching and wet etching.

In one embodiment, only the dummy gate electrode layers 236 may need to be removed to form the openings 280. That is, the dummy gate dielectric layers 235 may not be removed. Specifically, after removing the second mask layer 270, the dummy gate electrode layers 236 may be removed to form the openings 280 by using the portion of the first mask layer 240 formed on the top surface of the barrier structures 231 as an etch mask.

In one embodiment, the first mask layer 240 may not be formed. Therefore, the second mask layer 270 may be used as an etch mask to remove the dummy gate structures 232. Further, because the top surfaces of the dummy gate structures 232 may be easily oxidized, an oxide layer may be formed on the top surface of each dummy gate structure 232. At the beginning of the process to remove the dummy gate structures 232, an anisotropic dry etching process may often be required to remove a top portion of each dummy gate structure 232. Specifically, during the anisotropic dry etching process to remove the top portion of each dummy gate structure 232, the oxide layer may be removed by the ion bombardment effect. After removing the oxide layer, a wet etching process may then be performed to remove the remaining portion of each dummy gate structure 232 so that etching damages to the surface of the fin structure 220 on the bottom of the opening 280 may be reduced.

In one embodiment, the first mask layer 240 may not be formed and the second mask layer 270 may be used as the etch mask to remove the dummy gate structures 232. In addition, the second mask layer 270 may also cover a portion of the dummy gate structures 232. Therefore, the anisotropic dry etching process to remove the top portion of each dummy gate structure 232 may not be able to remove the oxide layer together with a certain amount of the dummy gate structure 232 under the oxide layer. Further, during the wet etching performed subsequently to remove the remaining portion of the dummy gate structure 232, both the second mask layer 270 and the oxide layer may block the removal of the dummy gate structure 232 under the second mask layer so that the dummy gate structure 232 may not be completely removed.

In one embodiment, the portion of the first mask layer 240 formed on the top surfaces of the plurality of dummy gate structures 232 may be removed, and then using the portion of the first mask layer 240 formed on the top surfaces of the barrier structures 231 as an etch mask to remove the plurality of dummy gate structures 232. The process to remove the dummy gate structures 232 described above may reduce the requirements on the position precision of the second mask layer 270.

Specifically, the distance between the barrier structure 231 and the neighboring dummy gate structure 232 may be small, e.g. in a range of 40 nm to 70 nm; in addition, the distance between the barrier structure 231 and the neighboring dummy gate structure 232 may also be affected by the precision of the photolithography process. Therefore, during the formation process for the second mask layer 270, the formed second mask layer 270 may simultaneously cover the top surfaces of the barrier structures 231 as well as the first mask layer 240, including the portion of the first mask layer 240 formed on the dummy gate structures 232.

Further, in a case that the second mask layer 270 may also cover a portion of the first mask layer 240 formed on the top surfaces of the dummy gate structures 232, because the portion of the first mask layer 240 formed on the dummy gate structures 232 may have a small volume and may be situated on the top of the dummy gate structures 232, the portion of the first mask layer 240 on the dummy gate structures 231 may be more sufficiently exposed in the corresponding etching environment. Therefore, the entire portion of the first mask layer 240 formed on the dummy gate structures 232 may be easily removed.

Further, the second mask layer 270 may be removed. After removing the second mask layer 270, the dummy gate structures 232 may then be removed by using the portion of the first mask layer 240 formed on the top surfaces of the barrier structures 231 as an etch mask. Specifically, the portion of the first mask layer 240 formed on the top surfaces of the barrier structures 231 may not cover the dummy gate structures 232. Therefore, incomplete removal of the dummy gate structures 232 may be avoided. That is, even with an undesired position precision of the second mask layer 270, complete removal of the dummy gate structures 232 may still be ensured. Therefore, the fabrication process may reduce the requirement for the position precision of the second mask layer 270.

Further, returning to FIG. 13, a plurality of metal gate structures may be formed in the openings (S310). FIG. 12 shows a schematic cross-section view of a corresponding semiconductor structure.

Referring to FIG. 12, a metal gate structure 237 may be formed in each opening 280 (referring to FIG. 11). The metal gate structure 237 may further include a gate dielectric layer 238 formed on the bottom and the sidewall surfaces of the corresponding opening 280 (referring to FIG. 1) and a metal gate electrode layer 239 formed on the gate dielectric layer 238.

The gate dielectric layer 238 may be made of a high-k dielectric material (e.g. a material with a relative dielectric constant greater than 3.9), such as $HfO_2$, $La_2O_3$, HfSiON, $HfAlO_2$, $ZrO_2$, $Al_2O_3$, $HfSiO_4$, etc. The metal gate electrode layer 239 may be made of Al, Cu, Ag, Au, Ni, Ti, W, WN, or WSi.

Further, returning to FIG. 13, a second interlayer dielectric layer may be formed on the metal gate structures, the barrier structures, and the first interlayer dielectric layer, and then a plurality of conductive plugs may be formed on the source/drain regions through the first inter layer dielectric layer and the second interlayer dielectric layer (S311).

Referring to FIG. 12, after forming the plurality of metal gate structures 237, a second interlayer dielectric layer 291 may be formed on the metal gate structures 237, the barrier structures 231, and the first interlayer dielectric layer 260. Further, a conductive plug 292 may be formed through the first interlayer dielectric layer 260 and the second interlayer dielectric layer 291 to electrically connect to each source/drain region 250.

The second interlayer dielectric layer may be made of a material including $SiO_x$, SiON, SiCO, etc. The second interlayer dielectric layer may be formed by a deposition process, such as plasma-enhanced chemical vapor deposition (PECVD), low pressure chemical vapor deposition, or sub-atmospheric pressure chemical vapor deposition.

In one embodiment, the second interlayer dielectric layer 291 may also cover the first mask layer 240. The conductive plug 292 may be made of a metal such as W.

The conductive plug 292 may be formed by a process including the following steps. First, a hole (not shown) penetrating through the first interlayer dielectric layer 260 and the second interlayer dielectric layer 291 may be formed on each source/drain region 250. The hole may expose the surface of the source/drain region 250. Further, a conductive plug 292 may be formed to fill the hole.

In one embodiment, only the dummy gate electrode layers may be removed to form a plurality of openings. Accordingly, after forming the openings, the dummy gate dielectric layers may serve as gate dielectric layers for subsequently-formed gate structures. Further, a metal gate electrode layer may be formed on the gate dielectric layer in each opening. The metal gate electrode layer together with the gate dielectric layer may form a metal gate structure. Moreover, after forming the metal gate electrode layers, a second interlayer dielectric layer may be formed on the metal gate structures, the barrier structures, and the first interlayer dielectric layer. Finally, a conductive plug corresponding to each source/drain region may be formed through the first interlayer dielectric layer and the second interlayer dielectric layer.

In one embodiment, in the source/drain region 250 formed between the barrier structure 231 and the neighboring dummy gate structure 232, the surface of the portion of the source/drain region 250 formed close to the barrier structure 231 may not be lower than the surface of the portion of the source/drain region 250 formed close to the dummy gate structure 232. Therefore, after forming the metal gate electrode layers 239, the surface of the portion of the source/drain region 250 formed close to the barrier structure 231 may not be lower than the surface of the portion of the source/drain region 250 formed close to the metal gate electrode layer 239. Therefore, the stress in the corresponding channel induced by the source/drain region 250 formed between the barrier layer 231 and the neighboring metal gate electrode layer 292 may be increased.

Moreover, the barrier structures 231 may be kept after removing the dummy gate electrode layers 236. That is, the barrier structure 231 may not be replaced by the metal gate electrode layer 239. Because the barrier structures 231 may be formed by a material with desired insulating properties, the parasitic capacitance between the barrier structure 231 and the corresponding conductive plug 292 may be small so that the parasitic capacitance in the formed Fin-FET device may be reduced.

Further, the present disclosure also provides a Fin-FET device formed by the method described above. FIG. 12 shows a schematic cross-section view of a plurality of an exemplary Fin-FET device consistent with disclosed embodiments.

Referring to FIG. 12, the Fin-FET device may include a semiconductor substrate 200, a fin structure 220 formed on the surface of the semiconductor substrate 20X). The fin structure 220 may further include two peripheral regions III separated by a core region IV.

The Fin-FET device may include a plurality of metal gate structures 237 formed in the core region IV and a barrier structure 231 formed in each peripheral region III. Specifically, although the number of the metal gate structures 237 may be one or more, for illustration purposes, the Fin-FET device shown in FIG. 12 is described to have three metal gate structures 237 formed on the fin structure 220 in the core region IV. Moreover, each metal gate structure 237 may be formed across the fin structure 220 in the core region IV and may cover a portion of the top and the sidewall surfaces of the fin structure 220. Each barrier structure 231 may be formed across the fin structure 220) in the peripheral region III and may cover a portion of the top and the sidewall surfaces of the fin structure 220.

Further, each metal gate structure 237 in the core region IV may include a gate dielectric layer 238 formed across the fin structure 220 in the core region IV and a metal gate electrode layer 239 formed on the surface of the gate dielectric layer 238.

The Fin-FET device may include a plurality of source/drain regions 250 formed in the fin structure 220 between neighboring metal gate structures 237 or between each barrier structure 231 and the neighboring metal gate structure 237.

The Fin-FET device may also include a first interlayer dielectric layer 260 formed on the semiconductor substrate 200 and the fin structure 220. The first interlayer dielectric layer 260 may cover the sidewall surfaces of the metal gate electrode layers 239 and the sidewall surfaces of the barrier structure 231.

The electrical conductivity of the barrier structure 231 may be below 3.0E-4 S/m.

In one embodiment, the barrier structure 231 may include a barrier gate dielectric layer 233 formed across the fin structure 220 in the corresponding peripheral region III, and a barrier gate electrode layer 234 formed on the barrier gate dielectric layer.

The barrier gate dielectric layer 233 may be made of $SiO_x$ or a high-k dielectric material; while the barrier dielectric layer 234 may be made of polycrystalline silicon.

In other embodiments, the barrier structure may be formed by a single-layer material while the electric conductivity of the barrier structure may be below 3.0E-4 S/m. Specifically, when the barrier structure is made of a single-layer material, the barrier structure may be made of polycrystalline silicon or single-crystalline silicon.

In one embodiment, a first mask layer 240 may be formed on the top surfaces of the barrier structures 231. The first mask layer 240 may be made of $SiN_x$, SiON, or SiCON. The Fin-FET device may also include a second interlayer dielectric layer 291 and a plurality of conductive plugs 292. The second interlayer dielectric layer 291 may be formed on the plurality of metal gate structures 237, the barrier structures 231, and the first interlayer dielectric layer 260. Each conductive plug 292 may be formed above a source/drain region 250 to electrically connect to the corresponding source/drain region 250. The conductive plug 292 may be formed through the first interlayer dielectric layer 260 and the second interlayer dielectric layer 291.

Further, because the Fin-FET device may include the first mask layer 240, the second interlayer dielectric layer 291 may be formed on the plurality of metal gate structures 237, the barrier structures 231, the first interlayer dielectric layer 260, and the first mask layer 240.

The disclosed Fin-FET device may include a barrier structure formed in each peripheral region and across the fin structure. Further, the barrier structure may be used to restrict the space for forming the source/drain region. Therefore, the surface of the portion of the source/drain region formed close to the barrier structure may not be lower than the surface of the portion of the source/drain region formed close to the metal gate electrode layer, and thus the stress in the corresponding channel induced by the source/drain region formed between the barrier layer and the neighboring metal gate electrode layer may be increased.

Moreover, during the fabrication process, the barrier structure may not be replaced by the metal gate electrode layer. In addition, because the barrier structures may be formed by a material with desired insulating properties, the parasitic capacitance between the barrier structure and the corresponding conductive plug may be small so that the parasitic capacitance in the formed Fin-FET device may be reduced.

Compared to existing Fin-FETs and the fabrication methods, the disclosed Fin-FET and the fabrication methods may demonstrate several advantages.

According to the disclosed fabrication methods, a barrier structure may be formed in each peripheral region prior to forming the source/drain region. Therefore, during the subsequent process to form the source/drain region, the barrier structure together with the corresponding dummy gate structure may restrict the space for forming the source/drain region, and thus the surface of the portion of the source/drain region formed close to the barrier structure may not be lower than the surface of the portion of the source/drain region formed close to the metal gate electrode layer. Further, after forming the metal gate electrode layer, the source/drain region formed between the barrier structure and the metal gate electrode layer may not show any subsiding area. Therefore, the stress in the corresponding channel induced by the source/drain region between the barrier layer and the neighboring metal gate electrode layer may be increased.

Moreover, the barrier structures may be kept after removing the dummy gate electrode layers. That is, the barrier structure may not be replaced by the metal gate electrode layer. Because the barrier structures may be formed by a material with desired insulating properties, the parasitic capacitance between the barrier structure and the corresponding conductive plug may be small so that the parasitic capacitance in the formed Fin-FET device may be reduced.

Further, the fabrication process to form the source/drain regions may include: forming a trench by removing a portion of the fin structure between each barrier structure and the neighboring dummy gate structure, and then forming a source/drain region in each trench by forming a source/drain-region material layer in the trench. Because a barrier structure may be formed in each peripheral region, each side of the trench formed between the barrier structure and the neighboring dummy gate structure may have a trench sidewall exposing the fin structure. Further, during the fabrication process for the source/drain-region material layer, because the fin structure may be exposed by the trench sidewalls on both sides of the trench, the exposed portion of the fin structure by the trench sidewalls on both side of the trench may serve as a seed for the growth of the source/drain-region material layer. Therefore, the growth rate of the source/drain-region material layer close to the dummy gate structure may be the same as the growth rate of the source/drain-region material layer close to the barrier structure, which may prevent the formed source/drain region from being caved in from the side close to the dummy gate structure to the other side close to the barrier structure. Further, after forming the metal gate electrode layers, the surface of the portion of the source/drain region formed close to the barrier structure may not be lower than the surface of the portion of the source/drain region formed close to the metal gate electrode layer. Therefore, the corresponding channel stress induced by the source/drain region formed between the barrier structure and the neighboring metal gate electrode layer may be increased.

According to the disclosed Fin-FET device, a barrier structure may be formed across the fin structure in each peripheral region. The presence of the barrier structure may restrict the space for the formation of the source/drain region, and thus prevent the formed source/drain region from being caved in from the side close to the dummy gate structure to the other side close to the barrier structure.

Therefore, the corresponding channel stress induced by the source/drain region formed between the barrier structure and the neighboring metal gate electrode layer may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a Fin-FET device, comprising:
   forming a fin structure, including two peripheral regions and a core region between the two peripheral regions, on a semiconductor substrate;
   forming a plurality of dummy gate structures across the fin structure in the core region and a barrier structure across the fin structure in each peripheral region, wherein each dummy gate structure includes a dummy gate electrode layer formed on top and sidewall surfaces of the fin structure;
   forming a plurality of source/drain regions in a plurality of trenches formed in the fin structure between each barrier structure and the neighboring dummy gate structure and also between neighboring dummy gate structures, wherein each sidewall of the plurality of trenched exposes a same area of the fin structure;
   forming a first interlayer dielectric layer at least on the fin structure, wherein the first interlayer dielectric layer covers sidewall surfaces of the dummy gate structures and sidewall surfaces of the barrier structures;
   removing the dummy gate electrode layers to form a plurality of openings; and
   forming a metal gate electrode layer in each opening.

2. The method for fabricating the Fin-FET device according to claim 1, wherein the barrier structure in each peripheral region is formed simultaneously with the plurality of dummy gate structures in the core region.

3. The method for fabricating the Fin-FET device according to claim 1, wherein:
   the barrier structure has an electrical conductivity of less than about 3.0E-4 S/m.

4. The method for fabricating the Fin-FET device according to claim 3, wherein:
   the barrier structure has a multiple-layer structure including a barrier gate dielectric layer formed across the fin structure in the peripheral region and a barrier gate electrode layer formed on the barrier gate dielectric layer;
   the barrier gate dielectric layer is made of a material including $SiO_x$ and a dielectric material with a relative dielectric constant greater than about 3.9; and
   the barrier gate electrode layer is made of a material including polycrystalline silicon.

5. The method for fabricating the Fin-FET device according to claim 3, wherein:
   the barrier structure has a single-layer structure; and
   the barrier structure is made of single-crystalline silicon or polycrystalline silicon.

6. The method for fabricating the Fin-FET device according to claim 1, wherein:
   the dummy gate structure further includes a dummy gate dielectric layer formed across the fin structure in the core region; and
   the dummy gate electrode layer is formed on the dummy gate dielectric layer.

7. The method for fabricating the Fin-FET device according to claim 6, wherein:
   after forming the first interlayer dielectric layer and removing the dummy gate electrode layer, the dummy gate dielectric layer is removed to form the opening; and
   a gate dielectric layer is formed on bottom and sidewall surfaces of the opening before forming the metal gate electrode layer on the gate dielectric layer.

8. The method for fabricating the Fin-FET device according to claim 1, further including:
   forming a second interlayer dielectric layer on the metal gate electrode layer, the barrier structure and the first interlayer dielectric layer; and
   forming a conductive plug penetrating through the first interlayer dielectric layer and the second interlayer dielectric layer on each source/drain region.

9. A method for fabricating a Fin-FET device, comprising:
   forming a fin structure, including two peripheral regions and a core region between the two peripheral regions, on a semiconductor substrate;
   forming a plurality of dummy gate structures across the fin structure in the core region and a barrier structure across the fin structure in each peripheral region, wherein each dummy gate structure includes a dummy gate electrode layer formed on top and sidewall surfaces of the fin structure;
   forming a plurality of source/drain regions in the fin structure between each barrier structure and the neighboring dummy gate structure and also between neighboring dummy gate structures;
   forming a first interlayer dielectric layer at least on the fin structure, wherein the first interlayer dielectric layer covers sidewall surfaces of the dummy gate structures and sidewall surfaces of the barrier structures;
   removing the dummy gate electrode layers to form a plurality of openings; and
   forming a metal gate electrode layer in each opening, wherein:
   a first mask layer is formed on top surfaces of the barrier structures and the dummy gate structures;
   after forming the source/drain regions, the first interlayer dielectric layer formed to cover the sidewall surfaces of the dummy gate structures and the sidewall surfaces of the barrier structure also covers sidewall surfaces of the first mask layer; and
   a portion of the first mask layer formed on the top surface of each dummy gate structure is removed during the process to form the plurality of openings.

10. The method for fabricating the Fin-FET device according to claim 9, wherein:
    the first mask layer is made of a material including $SiN_x$, SiON, and SiCON.

11. The method for fabricating the Fin-FET device according to claim 9, wherein forming the first mask layer, the barrier structures and the plurality of dummy gate structures further includes:
    forming a dummy gate dielectric material layer on the semiconductor substrate and also on the fin structure in the core region and the peripheral regions;
    forming a dummy gate electrode material layer on the dummy gate dielectric material layer;
    forming a first mask material layer on a top surface of the dummy gate electrode material layer; and forming the plurality of dummy gate structures in the core region across the fin structure, the barrier structures in the peripheral regions across the fin structure, and the first mask layer on the top surfaces of the dummy gate structures and the barrier structures by patterning the first mask material layer, the dummy gate electrode material layer, and the dummy gate dielectric material layer.

12. The method for fabricating the Fin-FET device according to claim 9, wherein forming the plurality of openings includes:
   forming a second mask layer, wherein the second mask layer covers a portion of the first mask layer formed on each barrier structure;
   removing a portion of the first mask layer formed on top surfaces of the dummy gate structures using the second mask layer as a mask;
   removing the second mask layer; and
   removing the dummy gate electrode layers to form the plurality of openings using the portion of the first mask layer formed on the top surfaces of the barrier structures.

13. The method for fabricating the Fin-FET device according to claim 12, wherein:
   the second mask layer is made of a material including photoresist.

14. The method for fabricating the Fin-FET device according to claim 1, wherein forming the plurality of source/drain regions further includes:
   removing a portion of the fin structure between each barrier structure and the neighboring dummy gate structure and also between neighboring dummy gate structures to form a plurality of trenches; and
   forming a source/drain-region material layer in the plurality trenches to form the plurality of source/drain regions.

15. The method for fabricating the Fin-FET device according to claim 1, prior to forming the plurality of source/drain regions in the fin structure, further including:
   forming a plurality of sidewall spacers on both sides of each dummy gate structure.

16. The method for fabricating the Fin-FET device according to claim 9, wherein the barrier structure in each peripheral region is formed simultaneously with the plurality of dummy gate structures in the core region.

17. The method for fabricating the Fin-FET device according to claim 9, wherein:
   the barrier structure has an electrical conductivity of less than about 3.0E-4 S/m.

18. The method for fabricating the Fin-FET device according to claim 9, wherein:
   the barrier structure has a multiple-layer structure including a barrier gate dielectric layer formed across the fin structure in the peripheral region and a barrier gate electrode layer formed on the barrier gate dielectric layer;
   the barrier gate dielectric layer is made of a material including $SiO_x$ and a dielectric material with a relative dielectric constant greater than about 3.9; and
   the barrier gate electrode layer is made of a material including polycrystalline silicon.

19. The method for fabricating the Fin-FET device according to claim 9, wherein:
   the dummy gate structure further includes a dummy gate dielectric layer formed across the fin structure in the core region; and
   the dummy gate electrode layer is formed on the dummy gate dielectric layer.

20. The method for fabricating the Fin-FET device according to claim 9, further including:
   forming a second interlayer dielectric layer on the metal gate electrode layer, the barrier structure and the first interlayer dielectric layer; and
   forming a conductive plug penetrating through the first interlayer dielectric layer and the second interlayer dielectric layer on each source/drain region.

* * * * *